(12) United States Patent
Nikitin et al.

(10) Patent No.: US 9,583,413 B2
(45) Date of Patent: Feb. 28, 2017

(54) SEMICONDUCTOR DEVICE

(75) Inventors: Ivan Nikitin, Regengsburg (DE);
Joachim Mahler, Regensburg (DE);
Thomas Behrens, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 1430 days.

(21) Appl. No.: 12/371,029

(22) Filed: Feb. 13, 2009

(65) Prior Publication Data
US 2010/0207263 A1    Aug. 19, 2010

(51) Int. Cl.
*H01L 23/48*    (2006.01)
*H01L 23/373*    (2006.01)
(Continued)

(52) U.S. Cl.
CPC .......... *H01L 23/3733* (2013.01); *H01L 23/36* (2013.01); *H01L 24/32* (2013.01); *H01L 25/0657* (2013.01); *H01L 25/50* (2013.01); *H01L 24/40* (2013.01); *H01L 24/48* (2013.01); *H01L 24/73* (2013.01); *H01L 2224/29324* (2013.01); *H01L 2224/29339* (2013.01); *H01L 2224/29344* (2013.01); *H01L 2224/29347* (2013.01); *H01L 2224/29355* (2013.01); *H01L 2224/29364* (2013.01); *H01L 2224/29366* (2013.01); *H01L 2224/29369* (2013.01); *H01L 2224/29371* (2013.01); *H01L 2224/32145* (2013.01); *H01L 2224/32225* (2013.01); *H01L 2224/32245* (2013.01); *H01L 2224/40227* (2013.01); *H01L 2224/40247* (2013.01); *H01L 2224/45014* (2013.01); *H01L 2224/48091* (2013.01); *H01L 2224/48227* (2013.01); *H01L 2224/48247* (2013.01); *H01L 2224/73263* (2013.01); *H01L 2224/73265* (2013.01); *H01L 2224/8384* (2013.01); *H01L 2225/06513* (2013.01); *H01L 2225/06589* (2013.01); *H01L 2924/014* (2013.01); *H01L 2924/01005* (2013.01); *H01L 2924/01006* (2013.01); *H01L 2924/01013* (2013.01); *H01L 2924/01024* (2013.01); *H01L 2924/01028* (2013.01); *H01L 2924/01029* (2013.01); *H01L 2924/01033* (2013.01); *H01L 2924/01046* (2013.01); *H01L 2924/01047* (2013.01); *H01L 2924/01075* (2013.01); *H01L 2924/01078* (2013.01); *H01L 2924/01079* (2013.01); *H01L 2924/01082* (2013.01); *H01L 2924/12044* (2013.01); *H01L 2924/14* (2013.01); *H01L 2924/1461* (2013.01)

(58) Field of Classification Search
USPC .............................. 257/690, E23.01, E23.08
See application file for complete search history.

(56) References Cited

U.S. PATENT DOCUMENTS 5,138,177 A * 8/1992 Morgan et al. ................ 250/551
5,379,942 A * 1/1995 Kuhnert et al. ............... 228/106
(Continued)

FOREIGN PATENT DOCUMENTS

DE    100 62 108 A1    6/2002

*Primary Examiner* — Marc Armand
*Assistant Examiner* — Sarah Salerno
(74) *Attorney, Agent, or Firm* — Dicke, Billig & Czaja, PLLC

(57) ABSTRACT

A semiconductor device includes a first chip coupled to an electrical insulator, and a sintered heat conducting layer disposed between the electrical insulator and the first chip.

11 Claims, 6 Drawing Sheets

(51) Int. Cl.
*H01L 23/36* (2006.01)
*H01L 25/065* (2006.01)
*H01L 25/00* (2006.01)
H01L 23/00 (2006.01)

(56) References Cited

U.S. PATENT DOCUMENTS

| | | | |
|---|---|---|---|
| 5,654,589 A * | 8/1997 | Huang et al. | 257/763 |
| 6,031,279 A | 2/2000 | Lenz | |
| 6,812,559 B2 | 11/2004 | Palm et al. | |
| 2004/0245648 A1* | 12/2004 | Nagasawa et al. | 257/772 |
| 2007/0018191 A1* | 1/2007 | Roh et al. | 257/99 |
| 2007/0057357 A1* | 3/2007 | Chen | 257/686 |
| 2007/0128827 A1 | 6/2007 | Faris | |
| 2008/0160183 A1* | 7/2008 | Ide et al. | 427/126.5 |
| 2010/0019391 A1* | 1/2010 | Strzalkowski | 257/777 |

* cited by examiner

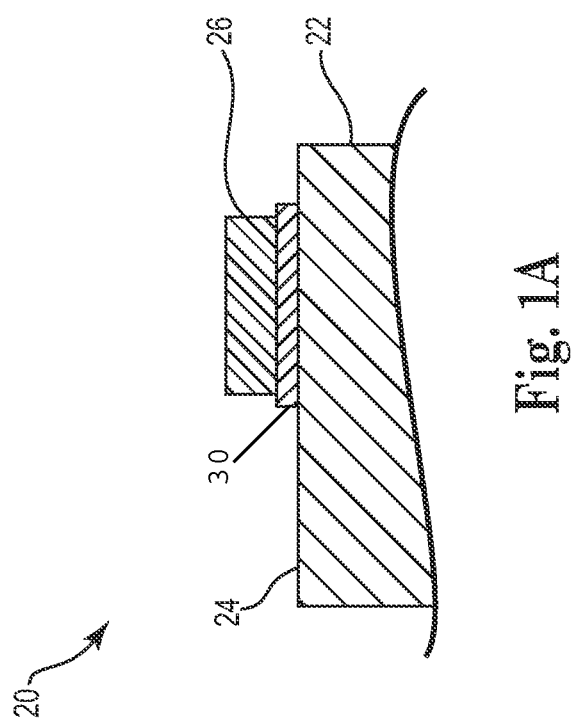

SEMICONDUCTOR DEVICE

BACKGROUND

A semiconductor package provides a protective enclosure for one or more semiconductor chips and includes interconnects to the chip(s). Semiconductor packages are employed in mobile electronic devices, including cellular telephones and other communication devices, automotive electronics, as well as other technology platforms.

Some semiconductor packages are configured for package-on-package stacking. Such package-on-package stacks include the base package fabricated to include landing pad(s) that receive/connect an upper package with semiconductor chip(s) in the base package. It is desirable to provide package-on-package semiconductor stacks with improved heat dissipation, improved resistance to moisture ingress, and improved mechanical stability leading to improved chip reliability.

For these and other reasons, there is a need for the present invention.

SUMMARY

One aspect provides a semiconductor device including a first chip coupled to an electrical insulator, and a sintered heat conducting layer disposed between the electrical insulator and the first chip.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1A is a schematic cross-sectional view of a semiconductor structure according to one embodiment.

DETAILED DESCRIPTION

Figure 1B:
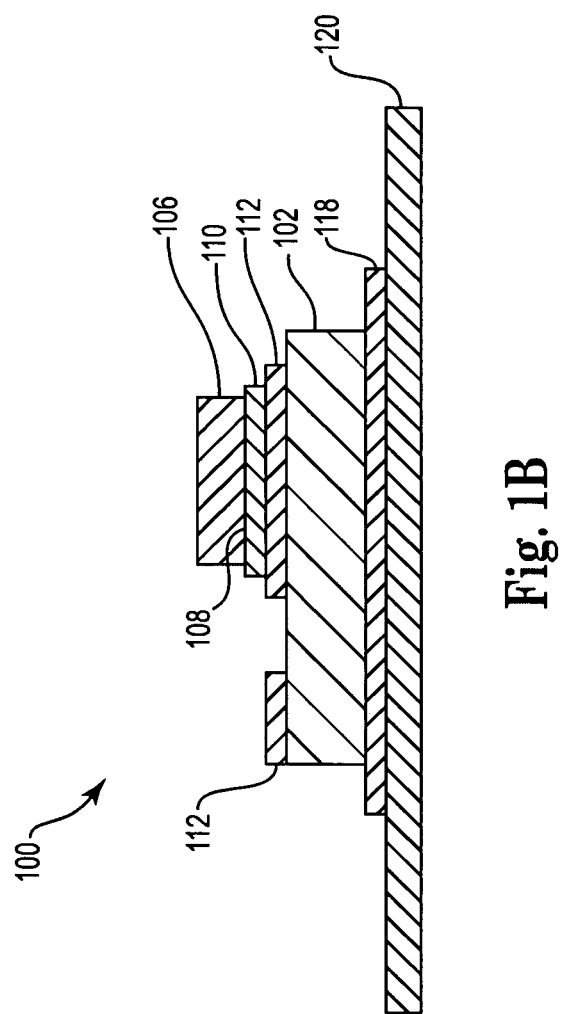
FIG. 1B is a schematic cross-sectional view of a semiconductor structure according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In addition, while a particular feature or aspect of one embodiment may be disclosed with respect to only one of several implementations, such feature or aspect may be combined with one or more other features or aspects of the other implementations as may be desired and advantageous for any given or particular application. Furthermore, to the extent that the terms "include," "have," "with," or other variants thereof are used in either the detailed description or the claims, such terms are intended to be inclusive in a manner similar to the term "comprise." Also, the term "exemplary" is merely meant as an example, rather than the best or optimal. The following detailed description, therefore, is not to be taken in a limiting sense, and the scope of the present invention is defined by the appended claims.

The embodiments of a method of fabricating a semiconductor device may use various types of semiconductor chips or semiconductor substrates, among them logic integrated circuits, analog integrated circuits, mixed signal integrated circuits, sensor circuits, MEMS (Micro-Electro-Mechanical Systems), power integrated circuits, chips with integrated passives, discrete passives and so on. In general the term "semiconductor chip" as used in this application can have different meanings one of which is a semiconductor die or semiconductor substrate including an electrical circuit.

In several embodiments layers are applied to one another or materials are applied or deposited onto layers. It should be appreciated that any such terms as "applied" or "deposited" are meant to cover literally all kinds and techniques of applying layer onto each other. In one embodiment, they are meant to cover techniques in which layers are applied at once as a whole, like, for example, laminating techniques, as well as techniques in which layers are deposited in a sequential manner, like, for example, sputtering, plating, molding, chemical vapor deposition (CVD) and so on. One example for a layer to be applied is the redistribution layer (RDL). The redistribution layer can be in the form of a multilayer, in particular a multilayer including a repeating layer sequence.

The semiconductor chips may include contact elements or contact pads on one or more of their outer surfaces wherein the contact elements serve for electrically contacting the semiconductor chips. The contact elements may be made from any electrically conducting material, e.g., from a metal as aluminum, gold, or copper, for example, or a metal alloy, e.g., solder alloy, or an electrically conducting organic material, or an electrically conducting semiconductor material.

In some embodiments the semiconductor chips are covered with an encapsulant material. The encapsulant material includes any electrically insulating material like, for example, any kind of molding material, any kind of epoxy material, or any kind of resin material with or without any kind of filler materials. In special cases it could be advantageous to use a conductive encapsulant material. In the process of covering the semiconductor chips or dies with the encapsulant material, a fan-out of embedded dies is fabricated. The fan-out of embedded dies is arranged in an array having the form of a wafer and is referred to as a "reconfigured wafer." However, it should be appreciated that the fan-out of embedded dies is not limited to the form and shape of a wafer but can have any size and shape and any suitable array of semiconductor chips embedded therein.

In the claims and in the following description different embodiments of a method of fabricating a semiconductor device are described as a particular sequence of processes or measures, in particular in the flow diagrams. It is to be noted that the embodiments should not be limited to the particular sequence described. Particular ones or all of different processes or measures can also be conducted simultaneously or in any other useful and appropriate sequence.

Embodiments provide a sintered heat conducting layer configured to dissipate heat away from a chip attached to an electrical insulator. Embodiments also provide a sintered heat conducting layer disposed between a first chip and a second chip in a chip-on-chip assembly, where the sintered heat conducting layer dissipates heat from between an electrically insulating layer disposed between the two chips. The sintered heat conducting layer provides both electrical conductivity and improved heat transfer, especially in the case where the first chip is disposed on a polymer surface of the second chip.

In one embodiment, the sintered heat conducting layer is provided as a nano-paste material configured to create a conclusive connection between a semiconductor chip back side and another second semiconductor chip. Embodiments provide a package-on-package semiconductor stack having improved heat dissipation, improved resistance to moisture ingress, and improved mechanical stability leading to improved chip reliability.

Embodiments of the sintered heat conducting layer configured to dissipate heat away from a chip attached to an electrical insulator is usefully employed in these chip-on-chip and chip-by-chip applications. Embodiments provide nano-paste die attachment to dielectric and conductive layers of other dies. The nano-paste die attachment provides low temperature attachment of components with superior thermo-electrical properties comparable to higher temperature diffusion soldering attachment. In one embodiment, the semiconductor device described herein is a combination of a power semiconductor (e.g., SFET) base chip with an integrated circuit controller. This combination enables controlling of the power chip by IC-controller, which results in increased functionality in a small package fabricated at lower cost.

FIG. 1A is a schematic cross-sectional view of a semiconductor structure 20 according to one embodiment. Semiconductor structure 20 includes a first chip 26 coupled to an electrical insulator 22 and a sintered heat conducting layer 30 disposed between the electrical insulator 22 and the first chip 26. In one embodiment, electrical insulator 22 is a carrier.

FIG. 1B is a schematic cross-sectional view of semiconductor structure 100 according to one embodiment. Semiconductor structure 100 includes a first chip 102, a second chip 106 having an attachment surface 108 facing the first chip 102, and a sintered metal layer 110 connecting the first and second chips 102/106. Further, in one embodiment, electrically insulating layer 112 covers at least part of first chip 102. In one embodiment, sintered metal layer 110 is coupled to electrically insulating layer 112 opposite first chip 102. Second chip 106 is coupled to at least a portion of sintered metal layer 110 opposite electrically insulating layer 112.

Semiconductor chips 102/106 are fabricated on a semiconductor wafer made of suitable semiconductor material.

In one embodiment, the surface area of a semiconductor wafer is standardized according to predetermined wafer diameters such as 4 inches, 8 inches, 10 inches or 12 inches, for example. In one embodiment, the semiconductor wafers are diced, thereby separating the individual semiconductor chips. The thickness of the semiconductor wafers typically varies within ranges of between about 100 µm to 1,000 µm, although these values are suitably configured to be smaller or larger in various applications. In one embodiment, the semiconductor wafers are thinned, for example, by grinding their backsides down to a thickness in the range from 30 µm to 200 µm. In one embodiment, first chip 102 is smaller than second chip 106. In another embodiment, first chip 102 and second chip 106 are substantially the same size.

In one embodiment, first semiconductor chip 102 is placed on carrier 120. The size and shape of carrier 120 is not limited. In one embodiment, during the fabrication of the devices, carriers are connected to each other. In another embodiment, the carriers are made from one piece. In one embodiment, the carriers are connected among each other by connection mean with purpose of separating the carriers in the course of the fabrication. Separation of the carriers is carried out by mechanical sawing, a laser beam, cutting, stamping, milling, etching or any other appropriate method. The carriers, or parts of the carriers, are electrically conductive. They may be fabricated from metals or from metal alloys, for example, copper, copper alloys, iron nickel, aluminum, aluminum alloys or other appropriate materials. In one embodiment, the carriers are a lead frame of a part of a lead frame. In one embodiment, the carriers are plated with an electrically conductive material such as copper, silver, iron nickel or nickel phosphorous, for example. In one embodiment, the carriers are fabricated from polymers or paper and at least one surface of these carriers is coated with an electrically conductive material. The electrically conductive layer is produced by metal plating or depositing metal particles or any other appropriate method.

In one embodiment, sintered metal layer 110 is applied to first chip 102 and/or second chip 106. In one embodiment, sintered metal layer 110 provides heat conductivity from electrically insulating layer 112. In one embodiment, sintered metal layer 110 is comprised of multiple layers. In one embodiment, the metal layers are not homogenous or manufactured from just one material, that is to say, that various compositions and concentrations of the materials contained in the layers are possible. In one embodiment, sintered metal layer 110 includes aluminum, aluminum alloys, silver, gold, palladium gold, copper, nickel or other suitable metal alloy. In one embodiment, sintered metal layer 110 includes nano-particles of any desired metal or metal alloy, for example, aluminum, titanium, gold, silver, copper, palladium, platinum, nickel, chromium or nickel bandium. In one embodiment, the particle sizes within the metalized layer may, for example, be 1 µm to 40 µm. In one embodiment, only a fraction of the nano-particles in the metalized layer have such dimensions. For example, at least a percentage of the nano-particles have a dimension smaller than 1 µm or larger than 40 µm. Furthermore, in one embodiment, the nano-particles are disbursed in a suitable liquid, paste or solvent. In one embodiment, sintered metal layer 110 is applied as a layer with a thickness of 5 µm to 40 µm, for example, although other thicknesses are also acceptable. After application, the nano-particles are heated and thereby sintered. In one embodiment, sintered metal layer 110 is selectively patterned with any desired geometric shape, for example. Sintered metal layer 110, for example, is applied only to the electrodes of the semiconductor chips or to the complete attachment surface of the semiconductor chips.

In one embodiment, electrically insulating layer 112 is applied to first chip 102 on second surface 114 of first chip 102. In one embodiment, electrically insulating layer 112 is a polymer such as polyimid, polybenzoxazol or benzylcyclobuten, for example. In one embodiment, electrically insulating layer 112 reacts with metalized first surface 116 of second chip 106 to form a metal conclusive connection. In one embodiment, electrically insulating layer 112 is used on ceramic dielectric chip upper areas, for example, $SiO_2$ or $Si_3N_4$.

The selective application of die-attach 118 on chip carrier 120 and sintered metal layer 110 on first chip 102 is possible. In one embodiment, sintered metal layer 110 does not cover the entire surface of first chip 102. In one embodiment, second chip 106 does not cover the entire surface of sintered metal layer 110. In one embodiment, first surface 116 of second chip 106 is exposed for attachment of additional chips and/or other connection elements.

In one embodiment, die-attach 118 is sintered after applied to chip carrier 120. In another embodiment, sintered metal layer 110 is applied to chip carrier 120 and then fixated on first chip 102. A temperature process between 150° C. and 300° C. melts and sinters the nano-particles of sintered metal layer 110 and thereby produces a fixed connection between chip carrier 120 and first chip 102. Upon sintering, the particles form a porous sponge-like structure. This connection exhibits positive characteristics such as high thermal conductivity and a reduced thermal mechanical stress on first chip 102.

In one embodiment, die-attach 118 is a metal-particle nano-paste which includes silver particles, although other materials are also suitable. In one embodiment, die-attach 118 adheres to and hardens on dielectric materials and other materials. In one embodiment, die-attach 118 is applied to chip carrier 120 in a paste-like consistency. In another embodiment, die-attach 118 is applied to first chip 102. In one embodiment, after application die-attach 118 is sintered. In one embodiment, the melting and sintering of electrically insulating layer 112 and sintered metal layer 110 applied to second chip 106 is conducted under 300° C.

Figure 2:
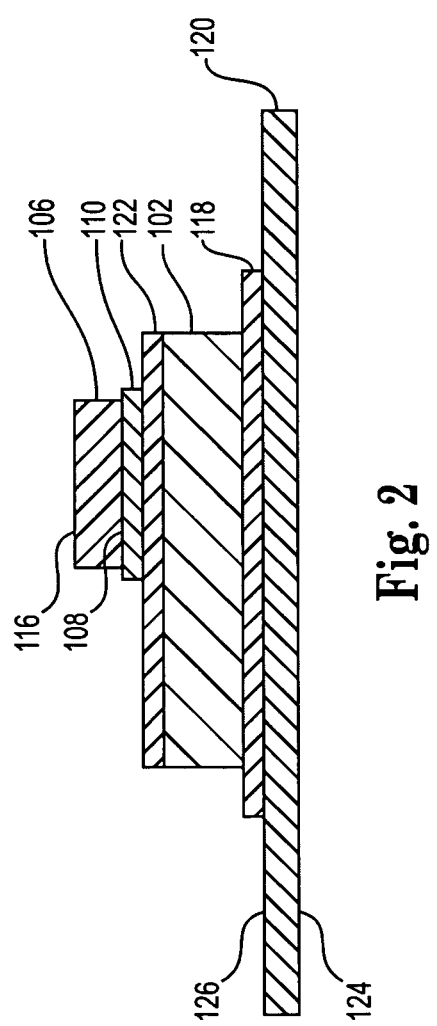
FIG. 2 is a schematic cross-sectional view of a semiconductor structure according to one embodiment.

As illustrated in FIG. 2, first chip 102 includes first attachment surface 104 and second surface 114 opposite first attachment surface 104. Additionally, second chip 106 includes first surface 116 and second surface 108 opposite first surface 116. In one embodiment, second surface 108 is an attachment surface facing first chip 102. In one embodiment, the attachment of first chip 102 to die-attach 118 and chip carrier 120 includes die-attach 118 applied to second face 126 opposite first face 124 of chip carrier 120 and chip 102 coupled to die-attach 118.

In one embodiment, sintered metal layer 110 is applied on metallization 122 of first chip 102. In one embodiment, metallization 122 is an electrically conductive layer. In one embodiment, metallization 122 is a metal such as aluminum, copper, silver, gold, or a ceramic, for example. In one embodiment, metallization 122 provides a solderable attachment surface of first chip 102. In this manner, a solderable attachment surface of first chip 102 is provided by a front-end process. In one embodiment, metallization layer 122 and/or die-attach 118 act as heat dissipation layers.

Figure 3:
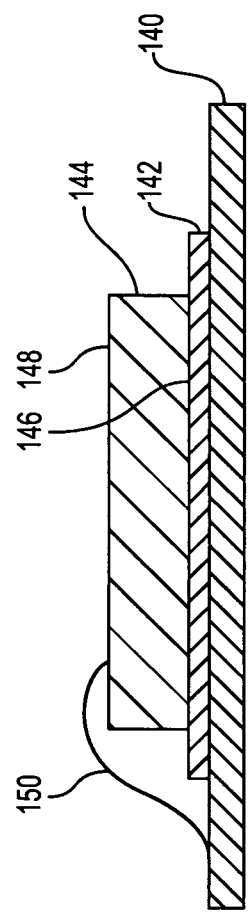
FIG. 3 is a schematic cross-sectional view of a semiconductor structure according to one embodiment.

FIG. 3 illustrates another embodiment of a semiconductor device. Semiconductor chip 144 with first face 146 and opposing second face 148 is placed on nano-paste 142. Nano-paste 142 is further applied to insulating chip carrier 140. The elements can be attached in any order. Nano-paste 142 acts as a chip carrier metallization and chip attachment means. In one embodiment, insulating chip carrier 140 is made of ceramic polymer or other suitable material. Connection elements 150 provide electric conductivity for semiconductor chip 144.

In one embodiment, as illustrated in FIG. 3, at least one connection element 150 electrically couples first chip 144 to insulating chip carrier 140. At least one connection element 150 electrically couples first chip 144 with insulating chip carrier 140. In one embodiment, connection element 150 is a bond wire, a ribbon or a clip or other suitable connection device. In one embodiment, first chip 144 is a power chip. In another embodiment, first chip 144 is a sacrificial chip and additional chips are stacked on first chip 144. The chips may be stacked in multiple layers and/or stacked with multiple chips in each layer.

Figure 4:
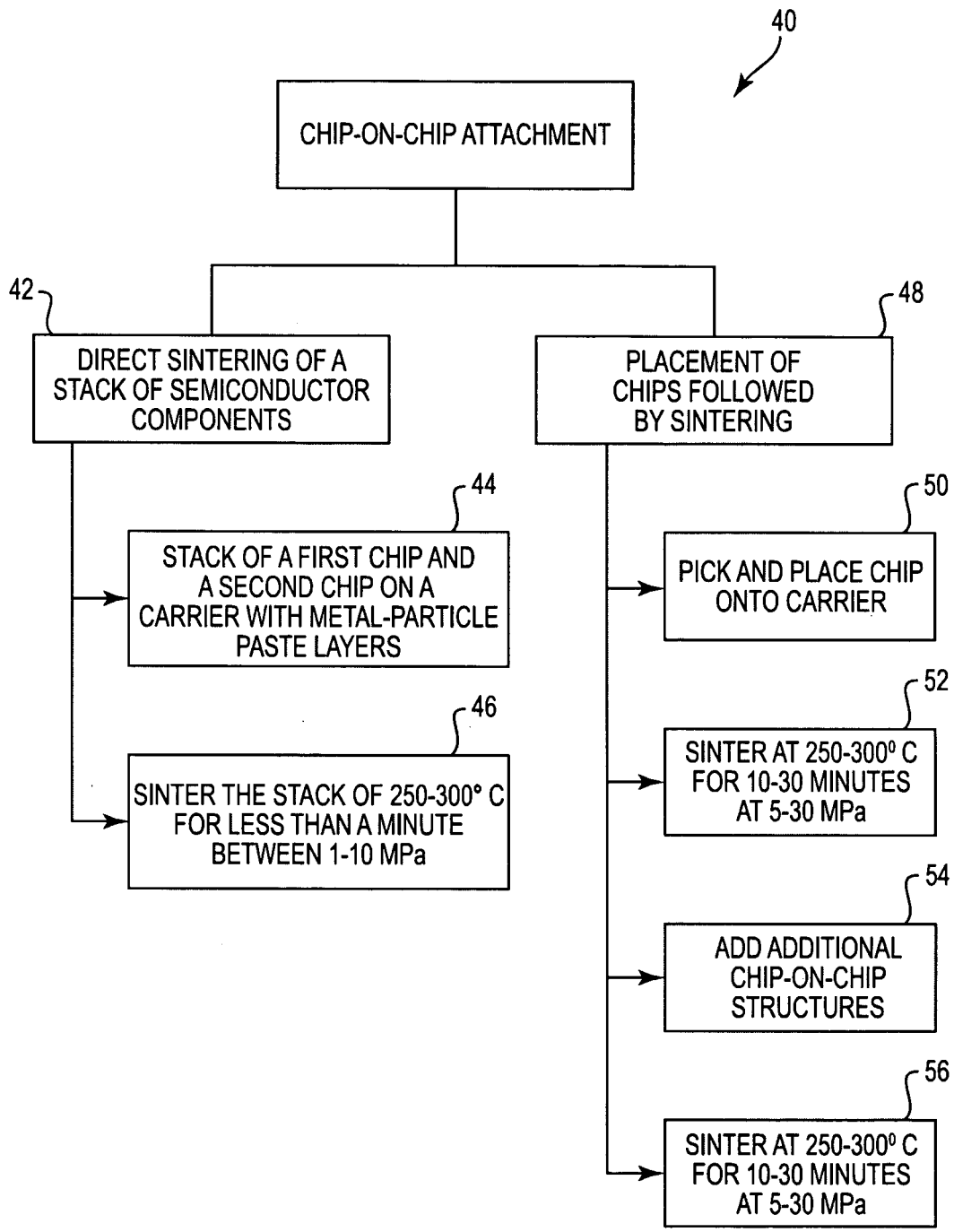
FIG. 4 is a block diagram of a chip-on-chip attachment process according to two embodiments.

FIG. 4 is a block diagram of a chip-on-chip attachment process 40 according to two embodiments. At 42, the process 40 is embodied as a direct sintering of a stack of semiconductor components. In one embodiment, direct bonding process of sintering a complete stack of components in place in a soft-solder die-bonder occurs. At 44, the stack includes a first chip and a second chip on a carrier with metal-particle paste layers. In one embodiment, the stack of semiconductor components including a carrier, a first metal-particle paste layer of a first thickness on the carrier, a first chip on the first metal-particle paste layer, a second metal-particle paste layer of a second thickness over the first chip, and a second chip on the carrier with a second metal-particle paste layer. At 46, the stack is sintered at 250-300° C. for less than a minute between 1-10 MPa. In one embodiment, placements and sintering is conducted at 250-300° C. for 700 ms and 5 MPA. In one embodiment, sintering occurs on a copper or silver plated substrate.

In another embodiment, sintering takes place in multiple steps corresponding to the applications of the respective elements. At 48, the process 40 is embodied as placement of chips followed by sintering. At 50, pick and placement of a chip onto a carrier occurs. In one embodiment, the placement is conducted at a low temperature, for example, 20° C. for up to 50 ms on a glue foil. At 52, sintering is conducted at 250-300° C. for 10-30 minutes and a pressure of 5-30 MPa. At 54, additional chip-on-chip structures are added. At 56, sintering is conducted at 250-300° C. for 10-30 minutes and a pressure of 5-30 MPa. In one embodiment, the multi-step process includes pick and place of die-bond chips to carriers and forming a flip chip structure having high speed and accuracy.

Figure 5:
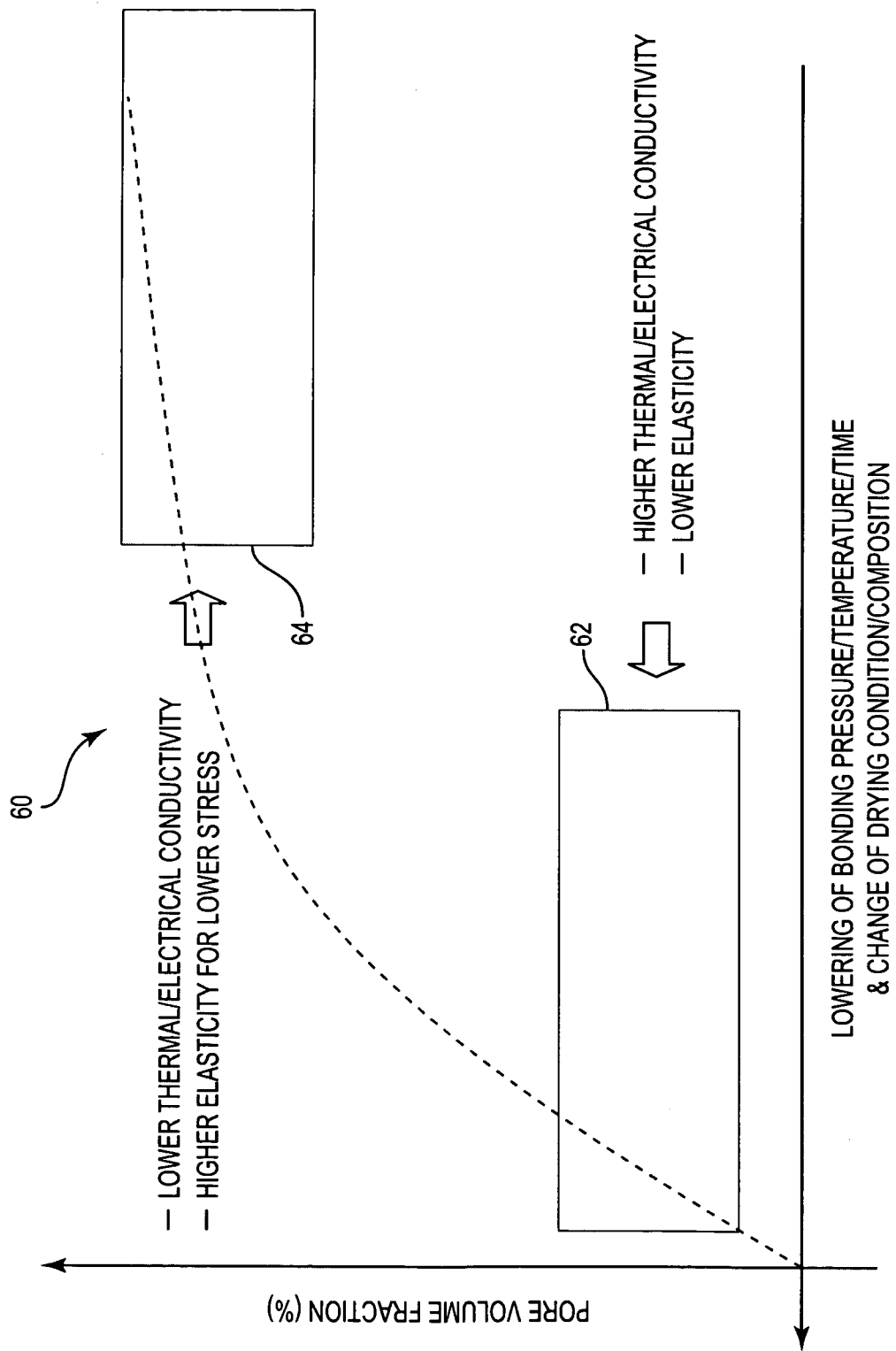
FIG. 5 is a representational graph of pore volume fraction versus bonding conditions according to one embodiment.

FIG. 5 is a representational graph 60 of pore volume fraction versus bonding conditions according to one embodiment. In one embodiment, a stack of semiconductor components including a first metal-particle layer of a first thickness and a second metal-particle layer of a second thickness is heated until the first and the second thickness are each reduced. Micrograph 62 illustrates a metal-particle layer wherein the pore volume fraction is low resulting in higher thermal and electrical conductivity and lower elasticity. Micrograph 64 illustrates the pore volume fraction decreased, by selectively altering the bond pressure, temperature, time and drying conditions, and the pore volume fractions driven down and particles are closer together.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
    a first chip coupled to an electrical insulator; and
    a sintered heat conducting layer disposed between the electrical insulator and the first chip, a first surface of the sintered heat conducting layer directly contacting a surface of the first chip, and a second surface of the sintered heat conducting layer directly contacting an electrically insulating surface of the electrical insulator,
    wherein the surface of the first chip is completely covered by the first surface of the sintered heat conducting layer.

2. The semiconductor device of claim 1, wherein the electrical insulator comprises a carrier.

3. The semiconductor device of claim 1, wherein electrical insulator is selected from the group consisting of polyimid, polybenzoxazol, benzycyclobuten.

4. The semiconductor device of claim 1, wherein the sintered heat conducting layer has a thickness between 5 µm and 40 µm.

5. The semiconductor device of claim 1, wherein the sintered heat conducting layer comprises silver nano-particles.

6. The semiconductor device of claim 1, wherein the first chip comprises a power transistor.

7. The semiconductor device of claim 1, wherein the electrical insulator is coupled to a second chip and the sintered heat conducting layer is disposed between the first chip and the second chip.

8. The semiconductor device of claim 7, wherein the first chip comprises contact elements on an attachment surface facing the second chip.

9. The semiconductor device of claim 7, further comprising a sintered metal layer attaching the second chip to a carrier.

10. The semiconductor device of claim 9, further comprising at least one connection element electrically coupling the first chip with one of the carrier and the second chip.

11. The semiconductor device of claim 10, wherein the at least one connection element is one of a bond wire, a ribbon, and a clip.

* * * * *